(12) United States Patent
Giles et al.

(10) Patent No.: US 7,719,057 B2
(45) Date of Patent: May 18, 2010

(54) MULTIPLE OXIDE THICKNESS FOR A SEMICONDUCTOR DEVICE

(75) Inventors: Martin D Giles, Portland, OR (US); David L Kencke, Beaverton, OR (US); Stephen M Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 11/830,182

(22) Filed: Jul. 30, 2007

(65) Prior Publication Data

US 2009/0032872 A1 Feb. 5, 2009

(51) Int. Cl.
*H01L 27/01* (2006.01)
*H01L 27/12* (2006.01)
*H01L 31/0392* (2006.01)

(52) U.S. Cl. ............... 257/347; 257/157; 257/E21.415

(58) Field of Classification Search ............... 257/157, 257/347, E21.415, E29.264
See application file for complete search history.

(56) References Cited

U.S. PATENT DOCUMENTS 6,740,931 B2 * 5/2004 Okumura et al. ............ 257/341
2008/0111185 A1 * 5/2008 Cheng ........................ 257/347

OTHER PUBLICATIONS

C.T.Liu et.al., "Multiple Gate Oxide Thickness for 2GHz System-on-a-chip Technologies" IEDM conference, 1998.

Peter L.D. Chang et al. "Floating Body Memory Cell Having Gates Favoring Different Conductivity Type Regions", U.S. Appl. No. 11/644,715, filed Dec. 22, 2006.

Ibrahim Ban et al. "Asymmetric Channel Doping For Improved Memory Operation For Floating Body Cell (Fbc) Memory", U.S. Appl. No. 11/444,941, filed May 31, 2006.

Peter G. Tolchinsky et al. "Method For Manufacturing A Silicon-On-Insulator (Soi) Wafer With An Etch Stop Layer", U.S. Appl. No. 10/987,775, filed Nov. 12, 2004.

Peter G. Tolchinsky et al. "Insulation Layer For Silicon-On-Insulator Wafer", U.S. Appl. No. 11/231,002, filed Sep. 16, 2005.

Jack Kavalieros et al. "Complementary Metal Oxide Semiconductor Integrated Circuit Using Uniaxial Compressive Stress And Biaxial Compressive Stress", U.S. Appl. No. 11/078,267, filed Mar. 11, 2005.

Rios, Rafael et al., "Isolated Tri-Gate Transistor Fabricated on Bulk Substrate", Filed on Jul. 18, 2007; U.S. Appl. No. 11/779,284.

* cited by examiner

*Primary Examiner*—Phuc T Dang
(74) *Attorney, Agent, or Firm*—Cool Patent, P.C.; Joseph P. Curtin

(57) ABSTRACT

Techniques associated with providing multiple gate insulator thickness for a semiconductor device are generally described. In one example, an apparatus includes a semiconductor fin having an impurity introduced to at least a first side of the fin, a first oxide having a first thickness coupled with the first side of the fin, and a second oxide having a second thickness coupled with a second side of the fin, the second thickness being different from the first thickness as a result of the impurity introduced to the first side of the fin.

20 Claims, 4 Drawing Sheets

Figure 3
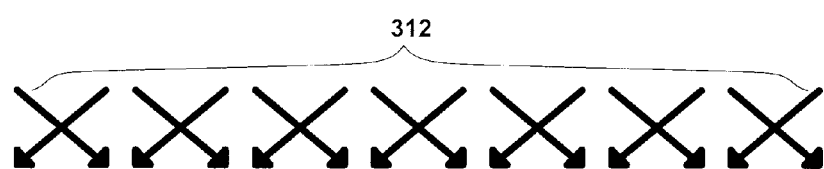
a) 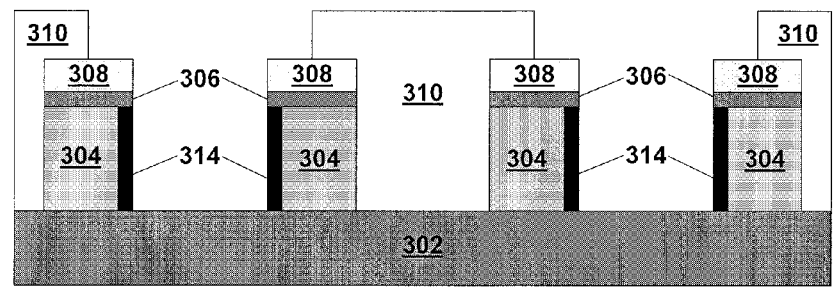
b) 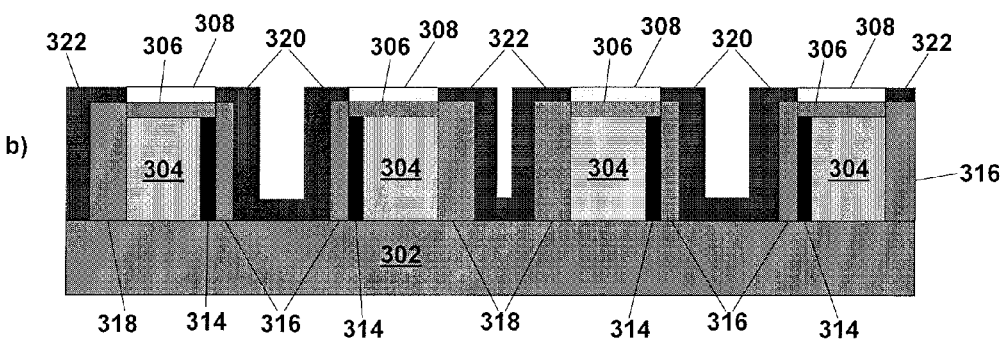

MULTIPLE OXIDE THICKNESS FOR A SEMICONDUCTOR DEVICE

TECHNICAL FIELD

Embodiments disclosed herein are generally directed to the field of semiconductor fabrication and, more particularly, to providing multiple oxide thickness for a semiconductor device.

BACKGROUND

Generally, semiconductor devices such as fin-based floating body memory devices have a gate dielectric material that typically includes an oxide grown on a semiconductor fin. Providing an oxide thickness for a front gate that is thinner than an oxide thickness for a back gate may enable a larger programming window with reduced disturb in a memory device when compared to a device having the same gate oxide thicknesses. Currently, multiple oxide growth steps may be used to achieve multiple oxide thickness for front and back gates. Multiple process steps incur significant costs that may be abated with fewer or less costly steps. Current approaches may also limit the multiple oxide thicknesses that can be formed. For example, it is difficult to make the back gate oxide as thin as desired in a silicon-on-insulator based dual gate device.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 3 is a schematic of a multiple oxide thickness technique using photoresist, according to but one embodiment.

Figure 1:
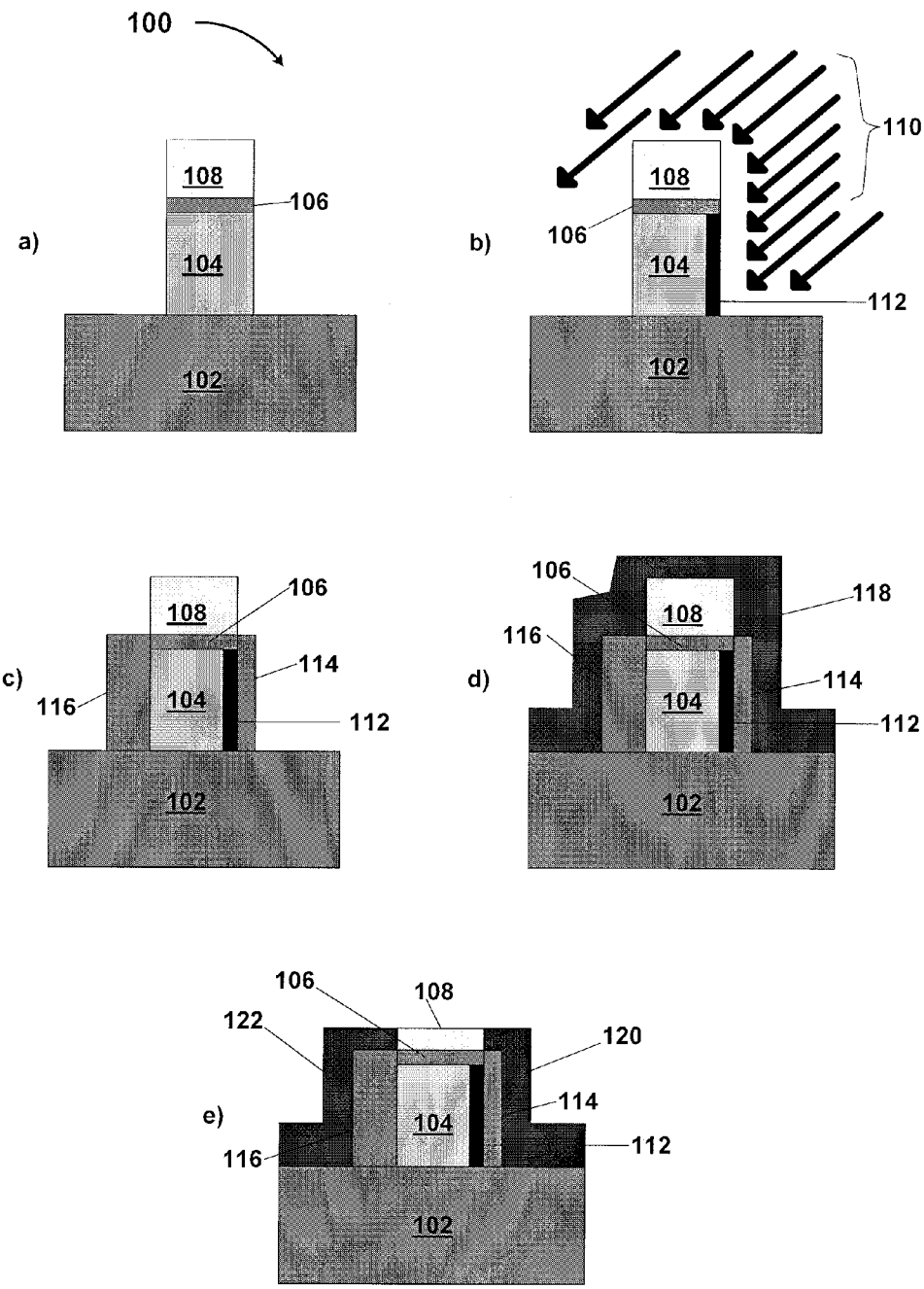
FIG. 1 is a process schematic for forming a multiple oxide thickness apparatus, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of multiple oxide thickness for a semiconductor device are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a process schematic for forming a multiple oxide thickness apparatus 100, according to but one embodiment. In an embodiment, each diagram of FIG. 1 shows a cross-section through the center of the channel of a semiconductor device. In an embodiment, FIG. 1a includes a substrate 102, semiconductor fin or pillar 104, oxide 106, and nitride 108, each coupled as shown. Oxide 106 and nitride 108 are not limited to these materials and may include a variety of functionally equivalent materials for fabricating a microelectronic device. Nitride 108 may be silicon nitride in an embodiment. In an embodiment, FIG. 1b includes the introduction of an impurity 110 to at least one side of semiconductor fin 104 to form a fin region 112 that includes an impurity 110. FIG. 1c includes an embodiment of multiple gate insulator materials 114, 116 having different thicknesses, where a first gate insulator 114 and second gate insulator 116 are coupled with fin 104 as shown. The gate insulators 114, 116, hereafter referred to simply as "oxide" may be a single material or multiple-material stack that may include a thermally grown oxide or oxide-based composite material. FIG. 1d includes a gate electrode material 118, coupled with the other features as shown. FIG. 1e depicts front gate 120 and back gate 122 that are formed after a planarization process, each coupled as shown.

In an embodiment, introducing an impurity 110 to a region 112 of a semiconductor fin affects the oxidation rate of the region 112. For example, a silicon fin region 112 subject to a nitrogen implant 110 dose of $5 \times 10^{14}$ cm$^{-2}$ followed by a 20 minute oxidation at 900° C. produces a first oxide 114 thickness of 5 nm compared to a second oxide 116 thickness of 12 nm for an unimplanted region of fin 104. In an embodiment, a front gate oxide 114 is thinner than a back gate oxide 116. Different oxide thickness 114, 116 for a gate dielectric material may be advantageous for a semiconductor device. Such advantage may be incorporated by fin-based, independently controllable double-gate (IDG) floating body cell (FBC) memory devices, among other memory devices, to improve the programming window and disturb margin. According to an embodiment, an FBC device having a front gate oxide 114 thickness of about 40 angstroms and a back gate oxide 116 thickness of about 100 angstroms is sufficient to show a benefit from a dual oxide thickness.

In an embodiment, an apparatus includes a substrate 102, a semiconductor fin 104 having an impurity 110 introduced to at least a first side 112 of the fin 104, the fin 104 being coupled with the substrate 102, a first oxide 114 having a first thickness coupled with the first side 112 of the fin 104, and a second oxide 116 having a second thickness coupled with a second side of the fin 104, the second thickness being different from the first thickness as a result of the impurity 110 introduced to the first side 112 of the fin 104. A related method includes introducing an impurity 110 to at least a first side of a semiconductor fin 104, forming a first oxide 114 having a first thickness on the first side of the fin 104, and forming a second oxide 116 having a second thickness on a second side of the fin 104, the second thickness being different from the first thickness as a result of the impurity 112 introduced to the first side of the fin 104.

In an embodiment, an impurity 110 is introduced to a fin region 112 by an implant method such as ion implantation. In an embodiment, a tilted implant is introduced 110 prior to the gate oxidation depicted in FIG. 1c. The implant orientation 110 may be chosen such that an exposed side 112 of a fin 104 receives the implant. Because of the angle of implant, the side of the fin opposite the implanted region 112 may be in a shadow region of the fin 104 and may remain unimplanted. Such effect is referred to as geometric shadowing.

In an embodiment, forming a first oxide 114 and a second oxide 116 occurs simultaneously. For example, a fin 104 may be exposed to heat and oxygen-containing ambient in a furnace to simultaneously grow a first oxide 114 and a second oxide 116. Simultaneous growth of oxides 114, 116 having different thicknesses may provide a benefit of reducing the number of process steps required to grow multiple oxide thickness resulting in reduced cost and/or time.

An impurity 112 may affect the oxidation rate of semiconductor fin 104 by reducing or increasing the rate of oxidation. In an embodiment, an impurity 112 reduces the rate of oxidation of a semiconductor fin 104. In an embodiment, an impurity including nitrogen is implanted 110 into a surface of a fin 112 to reduce the oxidation rate relative to areas of fin 104 not exposed to the nitrogen implant 110. In an embodiment, a first oxide 114 thickness is less than a second oxide 116 thickness as a result of an impurity 112 introduced to the first side of the fin 104. A surface having an impurity 112 such as nitrogen may oxidize at a slower rate than an unexposed surface of fin 104 resulting in a thinner oxide 114. Targeted thickness for a first oxide 114 and second oxide 116 may be achieved by modulating the dose of impurity introduced to a side of the fin 104, implant energy, oxidation time, ambient, and/or temperature. Other suitable impurities 110 instead of nitrogen may be introduced to a fin surface 112 to reduce the rate of oxidation of fin 104.

In another embodiment, an impurity 112 increases the rate of oxidation of a semiconductor fin 104. In an embodiment, an impurity including germanium or fluorine is implanted 110 into a surface of a fin 112 to increase the oxidation rate relative to areas of fin 104 not exposed to the implant 110. In an embodiment, a first oxide 114 thickness is greater than a second oxide 116 thickness as a result of an impurity 112 introduced to the first side of the fin 104. This embodiment may provide a thicker gate dielectric 114 for a front gate and a thinner gate dielectric 116 for a back gate (contrary to what is illustrated) or the locations of the front and back gates can exchanged so that the front gate remains the side with thinner gate dielectric. A germanium or fluorine-exposed surface 112 may oxidize at a faster rate than an unexposed surface of fin 104. Selected thickness targets for a first oxide 114 and second oxide 116 may be achieved by modulating the dose of impurity, implantation energy, oxidation time, ambient, and temperature. Other suitable impurities 110 instead of germanium or fluorine may be introduced to a fin surface 112 to increase the rate of oxidation of fin 104. Semiconductor fin 104 may typically include silicon, but may include any silicon-based semiconductor and/or other semiconductor material.

In an embodiment, substrate 102 is an oxide. An oxide substrate 102 may be formed upon a semiconductor substrate (not shown) such as a silicon-based wafer. In another embodiment, substrate 102 is a semiconductor such as silicon. For example, fin 104 may be formed from a bulk silicon substrate 102 by a patterning process according to an embodiment.

In an embodiment, a nitride material 108 is coupled with the silicon fin as depicted. A gate electrode 118 material may be coupled with the nitride 108 and coupled with the first oxide 114 and second oxide 116 as depicted. In an embodiment, a gate electrode includes polysilicon 118, which may be deposited by chemical vapor deposition (CVD) or any other suitable deposition method. In another embodiment, gate electrode 118 and nitride 108 are polished by a chemical/mechanical polish process to form an arrangement as depicted in FIG. 1e. According to an embodiment, a front gate 120 is coupled with a thinner gate oxide 114 and a back gate 122 is coupled with a thicker gate oxide 116. A front gate 120 may be a sensing gate and a back gate 122 may be a reservoir gate.

Figure 2:
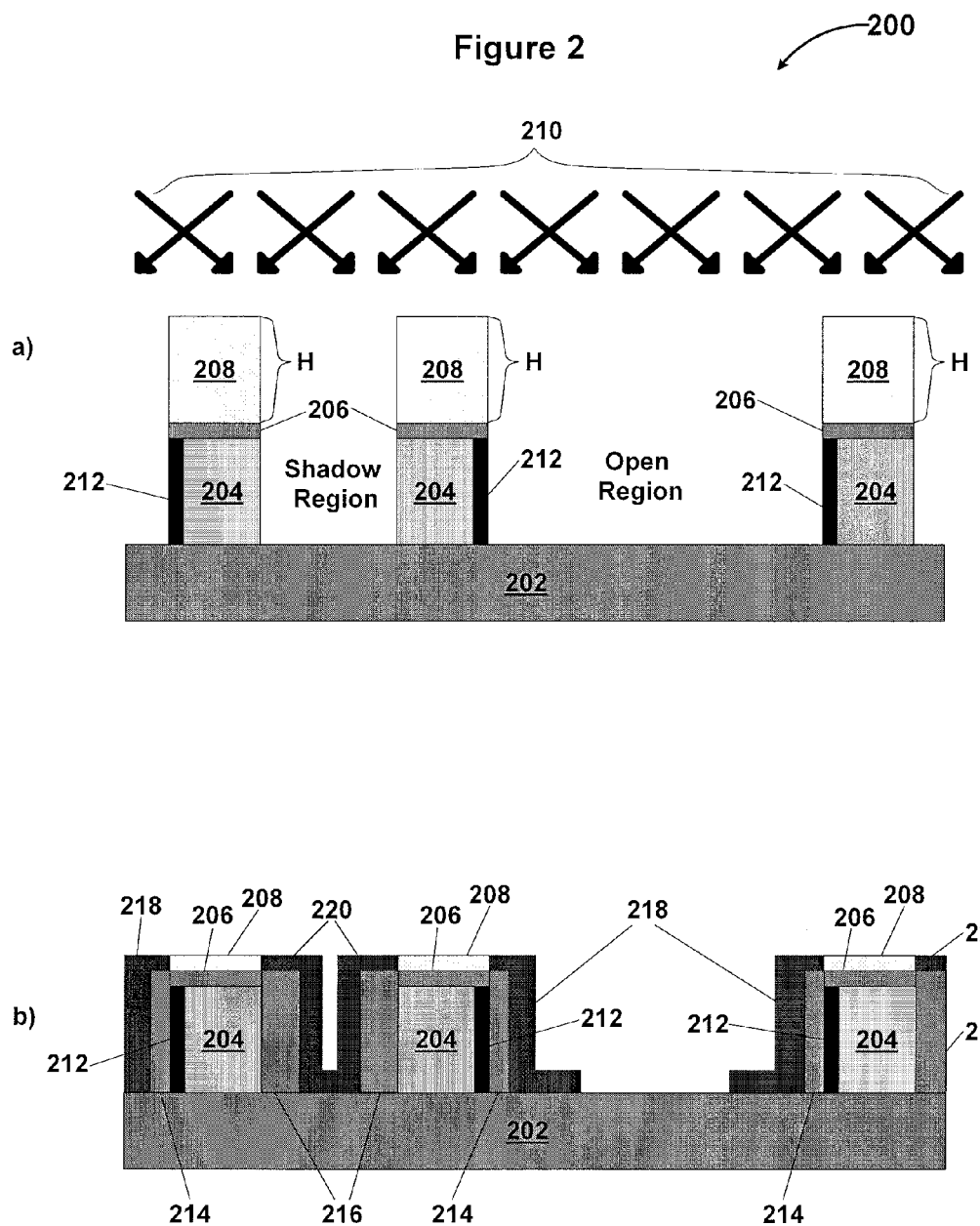
FIG. 2 is a schematic of a multiple oxide thickness technique using geometric shadowing, according to but one embodiment.

FIG. 2 is a schematic of a multiple oxide thickness technique using geometric shadowing 200. In an embodiment, FIG. 2a includes a substrate 202, one or more fins 204 coupled with the substrate 202, oxide 206, nitride 208 having a height, H, implant of an impurity 210, and one or more sides 212 of the one or more fins 204 that are exposed to an impurity 210, each coupled as shown. In an embodiment, FIG. 2b includes a substrate 202, one or more fins 204, capping oxide 206, nitride 208, front gate oxide 214, back gate oxide 216, front gate 218, and back gate 220, each coupled as shown. FIG. 2 may depict an embodiment for an array of gates 218, 220 having a thicker oxide 216 on alternating sides of the fins 204 to minimize contact area. FIG. 2a may illustrate a technique for introducing an impurity 210 to one or more sides 212 of one or more fins 204 in a shared back gate 220 embodiment. FIG. 2b may depict a shared back gate 220 embodiment after undergoing a process similar to that depicted and described with respect to FIG. 1.

Referring to FIG. 2a, an embodiment includes an open region where the sides 212 of one or more fins 104 are exposed to an angled implant 210 and a shadow region where the fins 104 themselves and/or the nitride 208 block exposure of the implant 210 to the sides of fins 104 within the shadow region. In an embodiment, an implant process introduces an impurity 210 such as nitrogen to one or more fin surfaces 212 within an open region. An implant 210 may first approach from one angle and then another angle as suggested by the arrows in FIG. 2a. In an embodiment, the fins 204 themselves provide geometric shadowing and block implant 210 in a shadow region based on the pitch and aspect ratio of the fins and the selected implant angle. In another embodiment, the nitride 208 is selected to have a height, H, to provide geometric shadowing to block implant in a shadow region for a given implant angle and/or pitch between fins 204.

Referring to an embodiment in FIG. 2b, a relatively thicker oxide 216 is grown in a shadow region between one or more fins 204 and a relatively thinner oxide 214 is grown in an open region. In an embodiment, a back gate 220 is shared between adjacent fins 204, but the front gates 218 are separated. According to an embodiment, every third fin is removed from a design layout with uniform pitch grid to allow sufficient space for adjacent front gate contacts.

FIG. 3 is a schematic of a multiple oxide thickness technique using photoresist 300, according to but one embodiment. In an embodiment, FIG. 3a includes a substrate 302, one or more semiconductor fins 304, capping oxide 306, nitride 308, photoresist 310, introduction of an impurity 312, and one or more sides 314 of the one or more fins 304 that are exposed to an impurity 312, each coupled as shown. In an embodiment, FIG. 3b includes a substrate 302, one or more semiconductor fins 304, capping oxide 306, nitride 308, front gate oxide 316, back gate oxide 318, front gate 320, and back gate 322, each coupled as shown. FIG. 3 may depict an embodiment for an array of gates 320, 322 having a thicker oxide 318 on alternating sides of the fins 304 to minimize contact area. In this embodiment, front 320 and back 322 gates are shared between adjacent fins 304. FIG. 3a may illustrate a technique for introducing an impurity 312 to one or more sides 314 of one or more fins 304 in a shared front gate 320 and shared back gate 322 embodiment. FIG. 3b may depict a shared front and shared back gate embodiment after undergoing a process similar to that depicted and described with respect to FIG. 1.

In an embodiment, a photomask is used to pattern resist 310 such that resist 310 covers selected sides of a fin 304 to prevent exposure to an impurity 312. In an embodiment, an impurity 312 such as nitrogen is implanted into one or more exposed surfaces 314 of the fins. In an embodiment, a first implant approaches from a first angle to introduce an impurity 312 to exposed surfaces 314 and then a second implant approaches from a second angle to introduce an impurity 312 to exposed surfaces 314 that were in a geometric shadow of the fins 304 and/or nitride 308 during the first implant. In an embodiment, nitride height 308 is selected to enable implant of exposed surfaces 314. For example, if nitride 308 is too high, it may create geometric shadowing that prevents desirable introduction of an impurity 312 to an exposed surface 314. In an embodiment, the resist 310 is stripped after implant and the array of fins 304 undergoes a process similar to that described with respect to FIG. 1 to achieve an embodiment illustrated in FIG. 3b.

In another embodiment, introduction of an impurity 312 to exposed surfaces 314 is accomplished by another deposition method such as vapor deposition, for example. In other embodiments, an array of gates as depicted in FIG. 3 comports with suitable embodiments already described with respect to FIGS. 1 and 2.

Figure 4:
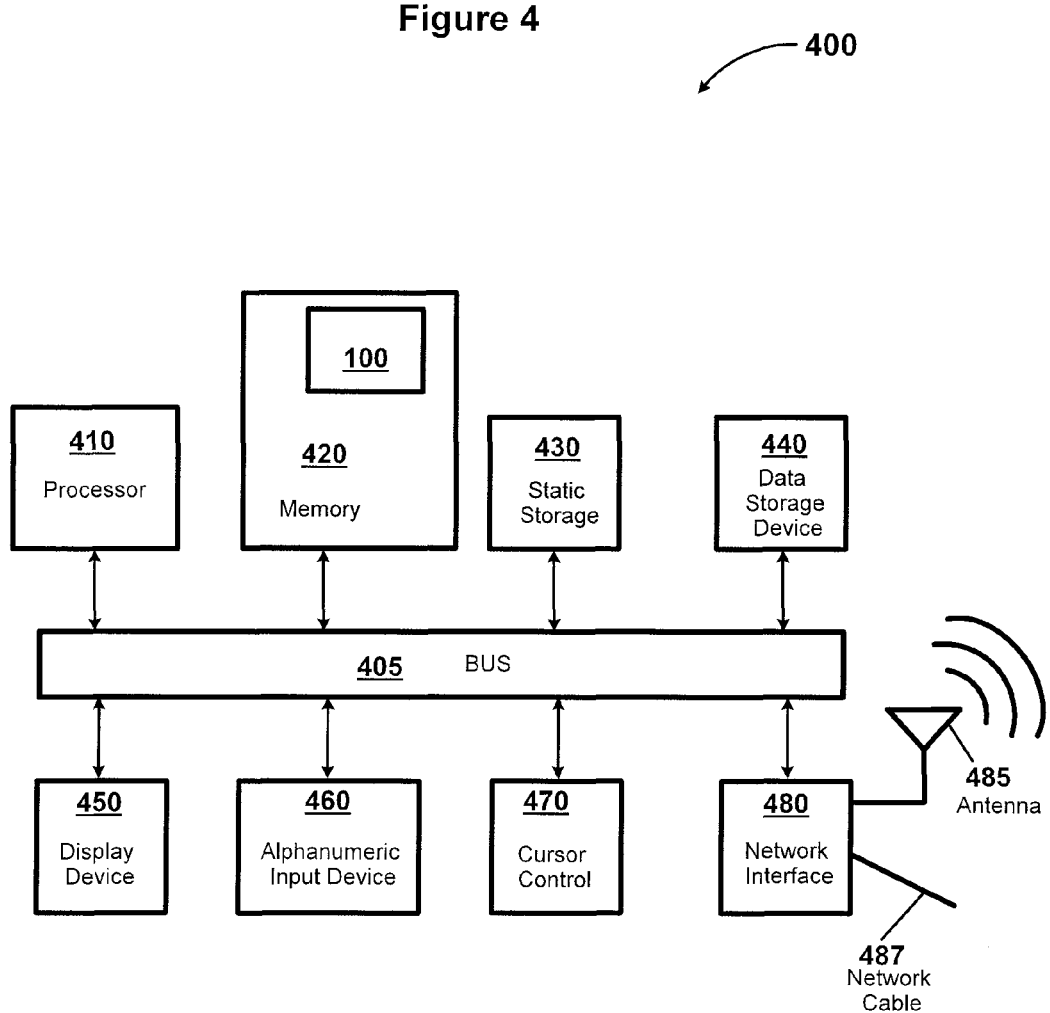
FIG. 4 is a diagram of an example system in which embodiments of the present invention may be used, according to but one embodiment.

FIG. 4 is a diagram of an example system in which embodiments of the present invention may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes a multiple oxide thickness arrangement in a semiconductor device 100 that accords with embodiments described with respect to FIGS. 1-3. In an embodiment, a multiple oxide thickness arrangement 100 is part of an electronic system's memory 420.

Electronic system 400 may include bus 405 or other communication device to communicate information, and processor 410 coupled to bus 405 that may process information. While electronic system 400 is illustrated with a single processor, system 400 may include multiple processors and/or co-processors. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes one or more gates formed using multiple oxide thickness techniques 100 disclosed herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 400 includes one or more omnidirectional antennae 485, which may refer to an antenna that is at least partially omnidirectional and/or substantially omnidirectional, and a processor 410 coupled to communicate via the antennae.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:
   a substrate;
   a first semiconductor fin coupled with the substrate, the first semiconductor fin comprising a first side and a second side, a first impurity being introduced into the first side of the first semiconductor fin;
   a second semiconductor fin coupled with the substrate, the second semiconductor fin comprising a first side and a second side, the first side of the second semiconductor fin being adjacent to the second side of the first semiconductor fin, the first impurity being introduced into the second side of the second semiconductor fin;
   a first oxide comprising a first thickness coupled with the first side of the first semiconductor fin and the second side of the second semiconductor fin; and
   a second oxide comprising a second thickness coupled with the second side of the first semiconductor fin and the first side of the second semiconductor fin, the second thickness being different from the first thickness as a result of the first impurity introduced to the first side of the first semiconductor fin and the second side of the second semiconductor fin.

2. An apparatus according to claim 1, wherein the first thickness is less than the second thickness as a result of the first impurity introduced to the first side of the first semiconductor fin and the second side of the second semiconductor fin.

3. An apparatus according to claim 2, wherein the first impurity comprises nitrogen introduced by implantation.

4. An apparatus according to claim 1, wherein the first thickness is greater than the second thickness as a result of the first impurity introduced to the first side of the first semiconductor fin and the second side of the second semiconductor fin.

5. An apparatus according to claim 4, wherein the first impurity comprises germanium or fluorine introduced by implantation.

6. An apparatus according to claim 1, wherein the substrate comprises oxide and the first and second semiconductor fins comprise silicon.

7. An apparatus according to claim 1, further comprising a first gate electrode coupled with at least a portion of the second oxide that is coupled with at least a portion of the second side of the first semiconductor fin and that is coupled with at least a portion of the first side of the second semiconductor fin.

8. An apparatus according to claim 7, wherein the second side of the first semiconductor fin and the first side of the second semiconductor fin comprise a second impurity introduced into the second side of the first semiconductor fin and the first side of the second semiconductor fin.

9. An apparatus according to claim 8, wherein the first impurity is different from the second impurity.

10. An apparatus according to claim 8, further comprising a third semiconductor fin coupled with the substrate and comprising a first side and a second side, the second side of the third semiconductor fin being adjacent to the first side of the first semiconductor fin, the second side of the third semiconductor fin comprising the first impurity introduced into the second side; and
   a second gate electrode coupled with at least a portion of the first oxide that is coupled with the first side of the first semiconductor fin and that is coupled with at least a portion of the second side of the third semiconductor fin.

11. An apparatus according to claim 10, wherein the first impurity is different from the second impurity.

12. An apparatus according to claim 11, wherein the first thickness is less than the second thickness as a result of the first impurity introduced to the first side of the first semiconductor fin and the second side of the second semiconductor fin.

13. An apparatus according to claim 12, wherein the first impurity comprises nitrogen introduced by implantation.

14. An apparatus according to claim 13, wherein the substrate comprises oxide and the first, second and third semiconductor fins comprise silicon.

15. An apparatus according to claim 11, wherein the first thickness is greater than the second thickness as a result of the first impurity introduced to the first side of the first semiconductor fin and second side of the second semiconductor fin.

16. An apparatus according to claim 15, wherein the first impurity comprises germanium or fluorine introduced by implantation.

17. An apparatus according to claim 16, wherein the substrate comprises oxide and the first, second and third semiconductor fins comprise silicon.

18. An apparatus according to claim 7, further comprising a third semiconductor fin coupled with the substrate and comprising a first side and a second side, the second side of the third semiconductor fin being adjacent to the first side of the first semiconductor fin, the second side of the third semiconductor fin comprising the first impurity introduced into the second side; and
   a second gate electrode coupled with at least a portion of the first oxide coupled with at least a portion of the first side of the first semiconductor fin and at least a portion of the second side of the third semiconductor fin.

19. An apparatus according to claim 18, wherein the second side of the first semiconductor fin and the first side of the second semiconductor fin comprise a second impurity introduced into the second side of the first semiconductor fin and the first side of the second semiconductor fin.

20. An apparatus according to claim 19, wherein the first impurity is different from the second impurity.

* * * * *

UNITED STATES PATENT AND TRADEMARK OFFICE
CERTIFICATE OF CORRECTION

| | | |
|---|---|---|
| PATENT NO. | : 7,719,057 B2 | Page 1 of 1 |
| APPLICATION NO. | : 11/830182 | |
| DATED | : May 18, 2010 | |
| INVENTOR(S) | : Martin D Giles et al. | |

It is certified that error appears in the above-identified patent and that said Letters Patent is hereby corrected as shown below:

On Title page, in Item (56), in column 1, under "U.S. PATENT DOCUMENTS" line 1, delete "Okumura et al." and insert -- Kouzuki et al. --, therefor.

Signed and Sealed this

Fifth Day of October, 2010

David J. Kappos
*Director of the United States Patent and Trademark Office*